(12) United States Patent
Suzuki et al.

(10) Patent No.: US 8,456,005 B2
(45) Date of Patent: Jun. 4, 2013

(54) TRANSPARENT CONDUCTIVE FILM AND METHOD FOR PRODUCING THE SAME

(75) Inventors: Shinichi Suzuki, Tokyo (JP); Hiroshi Takada, Tokyo (JP); Yusuke Kawahara, Saitama (JP)

(73) Assignee: Konica Minolta Holdings, Inc., Tokyo (JP)

( * ) Notice: Subject to any disclaimer, the term of this patent is extended or adjusted under 35 U.S.C. 154(b) by 45 days.

(21) Appl. No.: 12/738,787

(22) PCT Filed: Oct. 10, 2008

(86) PCT No.: PCT/JP2008/068464
§ 371 (c)(1),
(2), (4) Date: Apr. 19, 2010

(87) PCT Pub. No.: WO2009/054273
PCT Pub. Date: Apr. 30, 2009

(65) Prior Publication Data
US 2010/0247870 A1    Sep. 30, 2010

(30) Foreign Application Priority Data
Oct. 26, 2007    (JP) .................................. 2007-278688

(51) Int. Cl.
*H01L 23/48*    (2006.01)
(52) U.S. Cl.
USPC ................. 257/746; 257/59; 257/72; 257/91; 257/98; 313/506

(58) Field of Classification Search
USPC .. 428/209; 257/91–103, 59, 72, 746; 313/506
See application file for complete search history.

(56) References Cited

U.S. PATENT DOCUMENTS

| | | | | |
|---|---|---|---|---|
| 6,853,013 | B2 * | 2/2005 | Hirai et al. | 257/103 |
| 7,239,081 | B2 * | 7/2007 | Tsutsui | 313/503 |
| 7,372,006 | B2 * | 5/2008 | Aisenbrey | 219/535 |
| 7,462,984 | B2 * | 12/2008 | Handa et al. | 313/503 |
| 7,626,128 | B2 * | 12/2009 | Takada et al. | 174/393 |
| 7,695,648 | B2 * | 4/2010 | Winscom et al. | 252/512 |
| 7,749,407 | B2 * | 7/2010 | Hsu et al. | 252/511 |

FOREIGN PATENT DOCUMENTS

| | | |
|---|---|---|
| JP | 6360486 | 3/1988 |
| JP | 63269415 | 11/1998 |
| JP | 10340629 | 12/1998 |
| JP | 200519056 | 1/2005 |
| JP | 2005108467 | 4/2005 |
| JP | 2006253025 | 9/2006 |
| WO | 2005024853 | 3/2005 |

* cited by examiner

*Primary Examiner* — Cathy Lam
(74) *Attorney, Agent, or Firm* — Lucas & Mercanti, LLP

(57) ABSTRACT

A transparent conductive film which is excellent in transparency, electrical conductivity, in-plane uniformity and durability is disclosed, comprising a metal conductive pattern and a transparent conductive material on a transparent film substrate, wherein the transparent conductive material contains a conductive polymer and at least one of a conductive fiber and a conductive metal. A production method thereof is also disclosed.

8 Claims, 1 Drawing Sheet

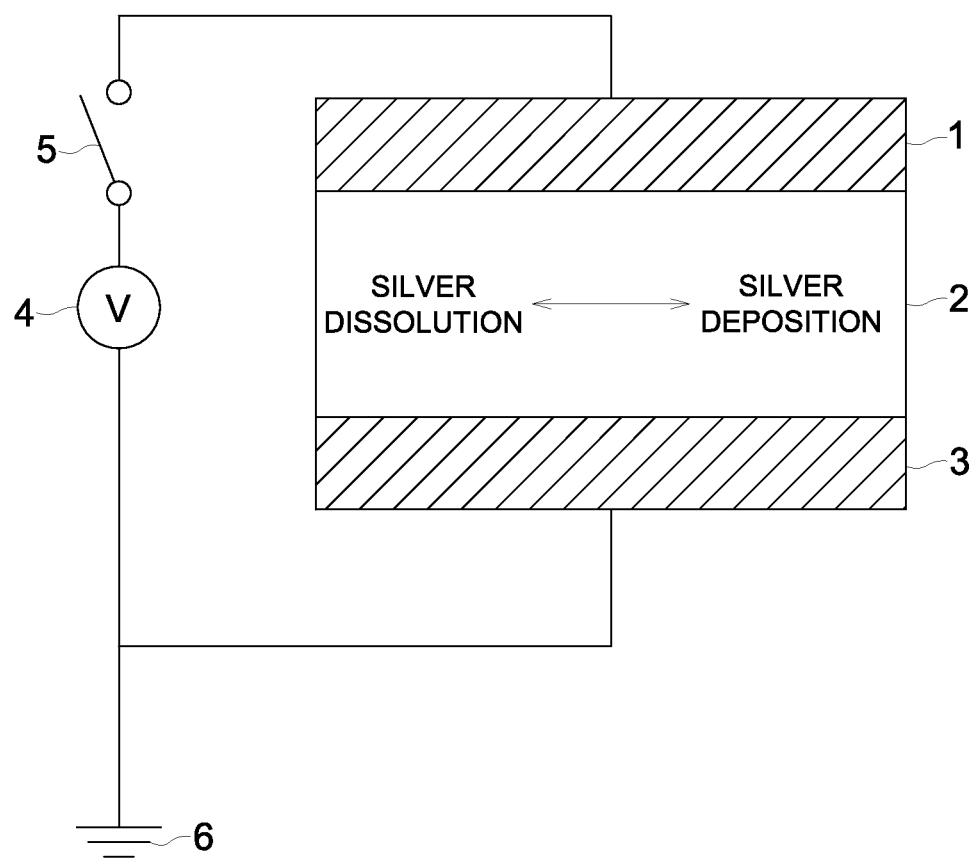

TRANSPARENT CONDUCTIVE FILM AND METHOD FOR PRODUCING THE SAME

CROSS REFERENCE TO RELATED APPLICATION

This is a U.S. National Phase Application under 35 U.S.C. 371 of International Application PCT/JP2008/068464, filed Oct. 10, 2008, which claims the priority of Japanese Application No. 2007-278688, filed Oct. 26, 2007, the entire content of both Applications are hereby incorporated by reference.

TECHNICAL FIELD

The present invention relates to a transparent electrically conductive film which is excellent in electrical conductivity, transparency, in-plane uniformity and repetitive durability and inexpensive, and a production method thereof.

TECHNICAL BACKGROUND

An ITO film in which an indium-tin composite oxide (ITO) is provided on a transparent film such as polyethylene terephthalate (PET) or polyethylene naphthalate (PEN) by a vacuum deposition process or a sputtering process has been mainly used for a transparent electrically conductive film in liquid crystal displays, electroluminescence displays, plasma displays, electrochromic displays, solar cells, electronic paper, touch panels or the like. However, such an ITO film easily cracks on deflection of the substrate, producing problems such that reduced conductivity often resulted.

On the other hand, there was also proposed a transparent conductive film which was made of a conductive polymer layer at a relatively low temperature and at low cost by a wet process. Such a transparent conductive layer formed of a conductive polymer exhibits flexibility of the film and is less likely to produce problems such as cracking; however, there were problems that such a conductive polymer is generally colored and in increasing thickness to achieve enhanced electrical conductivity, it loses its transparency.

Accordingly, there was proposed a method in which a metal auxiliary electrode and a transparent conductive film of a metal oxide such as ITO or a conductive polymer were provided as a transparent conductive film of enhanced transparency and conductivity and at a low price (as set forth in, for example, Patent documents 1-3).

However, in cases when the difference in conductivity between a metal auxiliary electrode and an auxiliary electrode is large, the area becomes larger, damage of overall uniformity also becomes larger. Specifically in a current-driving type such as an organic EL display or electronic paper of an electrodeposition type did not satisfactorily achieve emission uniformity, response speed for switching on screen and repetitive durability.

Patent document 1: JP 2005-302508A
Patent document 2: JP 2005-338230A
Patent document 3: JP 2006-352073A

DISCLOSURE OF THE INVENTION

Problems to be Solved

The present invention has come into being in view of the foregoing problems and circumstances and it is an object of the invention to provide a transparent electrically conductive film which is excellent in electrical conductivity, transparency, in-plane uniformity and repetitive durability and is also inexpensive, and a production method thereof.

Means for Solving the Problems

It was found by the inventors of this application in the process of making studies to solve the foregoing problems that, when using, as auxiliary electrodes, a metal conductive pattern and a transparent conductive film using a transparent conductive material as an electrode for an organic El display or electronic paper of an electrodeposition system, problems such as in-plane emission unevenness and delayed response speed for black and white switching became apparent and these problems were due to a large difference in conductivity between these auxiliary electrode and auxiliary electrode, whereby the present invention was achieved.

The above-described problems related to the invention are overcome by the following means.

1. A transparent conductive film comprising a metal conductive pattern and a transparent conductive material on a transparent film substrate, wherein the transparent conductive material comprises a conductive polymer and at least one of a conductive fiber and a conductive metal.

2. The transparent conductive film described in the foregoing 1, wherein the conductive metal comprises transparent metal nanoparticles.

3. The transparent conductive film described in the foregoing 1 or 2, wherein the transparent conductive material comprises a base metal-modified conductive polymer.

4. The transparent conductive film described in any of the foregoing 1 to 3, wherein the conductive fiber comprises a metal nano-wire.

5. The transparent conductive film described in any of the foregoing 1 to 4, wherein the transparent conductive material comprises an ionic liquid.

6. The transparent conductive film described in any of the foregoing 1 to 5, wherein the metal conductive pattern comprises silver.

7. A production method of a transparent conductive film, as described in any of the foregoing 1 to 6, the method comprising:

forming a desired metal conductive pattern by using a liquid ejecting apparatus provided with a liquid ejecting head having a nozzle to eject a charged liquid onto a transparent film substrate, a supplying means to supply a solution into the nozzle and an ejection voltage applying means to apply an ejection voltage to the solution in the nozzle, and then forming a transparent conductive material layer containing at least one of a conductive fiber and a conductive metal.

8. A production method of a transparent conductive film, as described in any of the foregoing 1 to 6, the method comprising:

forming a desired metal conductive pattern by providing a layer comprising silver halide grains on a transparent film substrate and subjecting the layer to exposure in a desired pattern and development, and then forming a transparent conductive material layer comprising at least one of a conductive fiber and a conductive metal.

Effect of the Invention

According to the foregoing means, there can be provided a transparent electric-conductive film which is excellent in electrical conductivity, transparency, in-plane uniformity and repetitive durability, and a production method of the same.

Thus, the means of the invention can provide a transparent conductive film of enhanced flexibility, used for a liquid crystal display, an electroluminescence display, a plasma display, an electrochromic display, a solar cell, an electronic paper, a touch panel and the like.

BRIEF DESCRIPTION OF THE DRAWING

FIG. 1 illustrates a schematic sectional view of ED electronic paper.

DESCRIPTION OF DESIGNATION

1: Transparent conductive film
2: Electrolyte layer
3: Silver electrode
4: Power source
5: Switch
6: Ground

PREFERRED EMBODIMENTS OF THE INVENTION

The transparent conductive film of the invention comprises a metal conductive pattern and a transparent conductive material on a transparent film substrate, featured in that the transparent conductive material contains an electrically conductive polymer and at least one of an electrically conductive fiber and an electrically conductive metal. This feature is a technical feature in common in the invention.

In the invention, the expression "transparent" represents total light transmittance in the visible light wavelength region being not less than 70%, which is measured in accordance with a method, based on JIS K 7361-1: 1997 (Testing method of a total light transmittance of plastic-transparent material).

Preferred embodiments of the invention include the conductive metal being a nanoparticle, the transparent conductive material containing a conductive polymer modified with a base metal, and the conductive fiber containing a metal nano-wire.

It is also a preferred embodiment that the transparent conductive material contains an ionic liquid or the metal conductive pattern contains silver.

The production method of a transparent conductive film of the invention preferably is a method which comprises forming a desired metal conductive pattern by the use of a liquid ejecting apparatus which is provided with a liquid ejecting head having a nozzle to eject a charged liquid onto a transparent film substrate, a supplying means to supply a solution into the nozzle and an ejection voltage applying means to apply an ejection voltage to the solution in the nozzle, and then forming a transparent conductive material layer containing at least one of a conductive fiber and a conductive metal; or a method which comprises forming a desired metal conductive pattern by providing a layer containing silver halide grains on a transparent film substrate and subjecting the layer to exposure in a desired pattern, followed by development, and then forming a transparent conductive material layer containing at least one of a conductive fiber and a conductive metal.

In the following, there will be detailed constituent elements of the invention and preferred embodiments of the invention.

Transparent Film Substrate

The transparent film substrate used in the invention may employ a plastic film.

Examples of a raw material of such a plastic film include polyesters such as polyethylene terephthalate and polyethylene naphthalate; polyolefins such as polyethylene (PE), polypropylene (PP), polystyrene and cyclic olefin resin; a vinyl resin such as polyvinyl chloride or polyvinylidene chloride, polyether ether ketone (PEEK), polysulfone (PSF), polycarbonate (PC), a polyamide, a polyimide, an acryl resin and a triacetyl cellulose (TAC).

Of these, a biaxially stretched polyethylene terephthalate film, an acryl resin film and a triacetyl cellulose film are preferred in terms of transparency, heat resistance, handling characteristics and cost, and a biaxially stretched polyethylene terephthalate film is more preferred.

A transparent substrate is preferably subjected to a surface treatment or provided with an adherend to achieve wettability or adhesiveness of a coating solution. Such a surface treatment or an adherend can be achieved by any conventional technique known in the art. In cases when a transparent substrate is a biaxially stretched polyethylene terephthalate film, an adherend adjacent to the film preferably exhibits a refractive index of 1.57 to 1.63, whereby interfacial reflection between the film substrate and the adherend is reduced, resulting in enhanced transmittance. The refractive index can be controlled by coating an oxide sol exhibiting a relatively high refractive index, such as tin oxide sol or cerium oxide sol, while controlling the ratio of such an oxide sol to a binder resin. An adherend may be a single layer but is preferably formed of two or more layers.

Metal Conductive Pattern

A metal conductive pattern related to the invention is one in which a metal material such as platinum, gold, silver, copper, aluminum, zinc, nickel, titanium, bismuth or their alloys is disposed in a mesh form, a comb form or the like. The shape of the pattern is not specifically restricted and includes, for example, a geometrical shape formed by combination of a triangle, a quadrilateral such as a square, a rectangle, a rhombus, a parallelogram or trapezoid; and a (regular) hexagon, a (regular) octagon or the like. Further, a metal material preferably uses silver and the use of silver can prevent coloring of a pattern portion without any harmful blackening treatment when used in combination with a transparent conductive material.

The line width or line interval of a metal conductive pattern may be any value but it is necessary to increase the line width to enhance conductivity. A conductive pattern preferably exhibits a conductivity of not more than 50Ω/□, and more preferably not more than 10Ω/□ in a single film without using a transparent conductive material.

On the other hand, it is preferred to increase the open-area percentage (a ratio of a portion having no thin line which forms a pattern to the whole portion), that is, it is preferred to thin a line width and to broaden a line interval. The open-area percentage is preferably not less than 80% and more preferably not less than 90%.

The line width is preferably not less than 1 μm and not more than 100 μm and the line interval is preferably from 50 to 1000 μm in terms of transparency and conductivity.

Formation of a conductive pattern may employ commonly known methods. For instance, patterning may be performed by a photolithography method; there may be employed a printing method, an ink jet method, or electrolytic or non-electrolytic metal plating; or using a silver salt photographic material, in which pattern formation is performed via exposure and development.

Of these, an ink-jet method, specifically an electrostatic ink jet method or a method of using a silver salt photographic material is preferred, in which pattern formation can be conducted precisely and continuously at a relatively low price.

Electrostatic Ink Jet Method

In the invention, an electrostatic ink jet method is a method of forming a pattern by using an apparatus installed with a liquid ejection head provided with a nozzle to eject a charged liquid and having an inner diameter of not more than 30 μm, a supplying means to supply a solution into the nozzle and an ejection voltage applying means to apply an ejection voltage to the solution in the nozzle.

It is preferred to form a pattern by using an ejection apparatus installed with a protruded meniscus forming means to allow a solution in the above-described nozzle to form a protruded shape at the top of the nozzle.

It is also preferred to employ a liquid ejecting apparatus which is provided with a motion control means to apply a driving voltage to drive the protruded meniscus forming means and to control application of an ejection voltage by an ejection voltage applying means, in which the motion control means is provided with a first ejection control section to applying a driving voltage of the protruded meniscus forming means when ejecting droplets, while applying the ejection voltage by the ejection voltage applying means.

It is preferred to employ a liquid ejecting apparatus, featured in that a second ejection control section is installed, which is provided with a motion control means to control driving the protruded meniscus forming means and applying a voltage by an ejection voltage-applying means, and the motion control means performing a motion to raise a solution by the protruded meniscus forming means, while being synchronized with application of the ejection voltage; further, it is also preferred that the motion control means employs a liquid ejection apparatus provided with a liquid level controlling section to control a motion of raising the solution and a motion to draw the liquid surface at the top of the nozzle back to the inside after applying an ejection voltage.

Thus, an electrode which is superior in on-demand property, little in disposal and excellent in dimensional precision can be advantageously obtained by preparation of an electrode pattern by such an electrostatic ink jet process.

Ink viscosity is preferably not less than 30 mP·s and more preferably not less than 100 mP·s.

Method by Use of Silver Salt Photosensitive Material

The method by use of silver salt photosensitive material refers to a process in which a layer containing silver halide grains is provided and subjected to light-exposure to a desired pattern, development and further to physical development. This method can readily form a desired electrically conductive pattern and results in no reduction in transmittance due to cross-point gain, often caused in printing. Further, subjecting it to physical development makes it unnecessary to a post-heating treatment which often deteriorates smoothness of the transparent substrate, whereby a preferred conductive pattern can be achieved.

Further, the thus formed silver pattern may be plated with copper, nickel, tin, silver, gold, platinum or various kinds of alloys.

A silver halide grain-containing layer may contain a binder, a hardener, a contrast-increasing agent, a surfactant or the like other than a photosensitive silver halide.

A binder is not specifically limited and may use any one of a water-soluble polymer and a water-insoluble polymer, but a water-soluble polymer, specifically gelatin is advantageously used. Further, there may appropriately be used hydrophilic colloids such as gelatin derivatives, a graft polymer of gelatin and other polymers, proteins other than gelatin, saccharide derivatives, cellulose derivatives, and synthetic hydrophilic polymeric substance such as a homo- or co-polymer.

The volume ratio of silver of silver halide grains to binder, that is, silver/binder is preferably not less than 0.3 and not more than 0.8, and more preferably not less than 0.4 and not more than 0.7. A ratio of less than 0.3 renders it difficult to attain sufficient electric-conductivity, even when subjected to physical development, while a ratio of more than 0.8 renders it difficult to sufficiently hold silver halide grains to the binder, causing aggregation of silver halide grains in the coating solution or resulting in deteriorated pattern-retention after forming a pattern and causing flaking of the pattern.

Silver halide grains may contain any halide composition, such as silver chloride, silver bromide, silver bromochloride, silver iodobromide, silver iodobromide, silver chloroiodobromide or silver iodochloride. In the invention, the composition of silver halide grains is silver bromochloride, in which the chloride content is preferably not les than 55 mol % to attain a silver concentration suitable for physical development and the bromide content is preferably from S to 45 mol % to achieve desired conductivity, and more preferably, the chloride content is not less than 70 mol % and the bromide content is from 10 to 30 mol %.

To lower the specific surface resistance of metallic silver grains formed after developing the silver halide grains, it is necessary to make the contact area between developed silver grains as large as possible. To enhance a surface area ratio, smaller silver halide grains are preferred but excessively small grains easily form a large aggregate, resulting in reduced contact area, so that the optimal particle size is presumed to be found. In the invention, the average particle size of silver halide grains, expressed in terms of equivalent cubic size, is preferably from 0.01 to 0.5 μm, and more preferably from 0.03 to 0.3 μm. The equivalent cubic size of a silver halide grain represents the length of an edge of a cube when the volume of the silver halide grain is converted to a cube. The average size of silver halide grains can be controlled by an appropriate combination of temperature, pAg, pH, addition rate of the silver ion solution or a halide solution, and a particle size-controlling agent (for example, 1-phenyl-5-mercaptotetrazole, 2-mercaptobenzimidazole, benztriazole, tetrazaindene compounds, nucleic acid derivatives, thioether compound, etc.) at the time when preparing the silver halide grains.

The shape of silver halide grains is not specifically restricted and includes various shapes, such as a spherical form, a cubic form, a plate form (for example, hexagonal plate form, triangular plate form, tetragonal plate form), octahedron and tetradecahedron). The particle size distribution is also not specifically restricted and preferably is a narrow distribution from the view point that when forming a pattern through exposure to light, a sharply defined pattern is reproduced and enhanced transparency is achieved with maintaining high conductivity. With respect to particle size distribution of silver halide grains used for a photosensitive material related to the invention is preferred mono-dispersed silver halide grains exhibiting a coefficient of variation of not more than 0.22 (more preferably not more than 0.15). The coefficient of variation is a factor representing the width of particle size distribution and is defined below:

Coefficient of variation=$S/R$ where $S$ represents a standard deviation of particle size distribution and $R$ represents an average particle size. Silver halide grains may also contain other elements. For example, it is useful to dope a metal ion which has been used in a photographic emulsion to obtain a high-contrast emulsion. Specifically, a metal ion of Groups 8-10, such as an iron ion, rhodium ion, ruthenium ion or iridium ion is preferred, which makes it easy to clearly distinguish exposed portions from unexposed portions in metallic silver image formation.

These metal ions may be added in the form of a salt or a complex salt to the silver halide grain emulsion. A transition metal ion, typified by a rhodium ion or an iridium ion may be in the form of compounds having various ligands. Examples of such ligands include a cyanide ion, a halogen ion, a thiocyanate ion, a nitrosyl ion, water and a hydroxide ion. Examples of a specific compound include potassium chlororhodate and potassium iridate.

The content of the foregoing metal ion compound included in silver halide grains is preferably from $10^{-10}$ to $10^{-2}$ mol/Ag and more preferably from $10^{-9}$ to $10^{-3}$ mol/Ag.

To allow metal ions described above to be included in silver halide grains, such a metal compound may be added at any stage before, during or after forming silver halide grains, or during physical ripening. Addition of a solution of such a heavy metal compound may be conducted over all or a part of the grain forming process.

The silver halide emulsion is preferably subjected to chemical sensitization, as is done in a photographic emulsion. Chemical sensitization can employ, for example, noble metal sensitization such as gold, palladium or platinum sensitization; chalcogen sensitization such a sulfur sensitization by use of an organic sulfur compound and reduction sensitization by use of tin chloride or hydrazine.

Silver halide grains are preferably subjected to spectral sensitization. Preferred examples of a spectral sensitizing dye include a cyanine, a carbocyanine, a dicarbocyanine, a complex cyanine, a hemi-cyanine, a styryl dye, a merocyanine, a complex merocyanine and a holopolar dye. Spectral sensitizing dyes may be used singly or in combination thereof.

Of these dyes, useful dyes are a cyanine dye, a merocyanine dye and a complex merocyanine dye. Any basic heterocyclic nucleus which is available in conventional cyanine dyes is usable in these dyes. Specific examples of such a nucleus include a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, and these nuclei condensed with an aliphatic hydrocarbon ring and these nuclei condensed with an aromatic hydrocarbon ring, such as an indolenine nucleus, a benzindolenine nucleus, an indole nucleus, a benzoxazole nucleus, a naphthooxazole nucleus, a benzothiazole ring, a naphthothiazole ring, a benzoselenazole nucleus, a benzimidazole nucleus, a quinoline nucleus, and the like. These rings may be substituted on a carbon atom.

A 5- or 6-membered heterocyclic nucleus, such as a pyrazoline-5-one nucleus, a thiohydantoin nucleus, a thiooxazolidine-2,4-dione nucleus, a rhodanine nucleus or a thiobarbituric acid nucleus, as a nucleus having a ketomethylene structure, is applicable to a merocyanine dye or a complex merocyanine dye.

These sensitizing dyes may be used singly or in their combination. The combination of sensitizing dyes is often employed for supersensitization.

A sensitizing dye may be directly added to a silver halide emulsion, or may be dissolved in a solvent such as water, methanol, propanol, methyl cellosolve or 2,2,3,3-tetrafluoropropanol and then added to the emulsion. Further, there may be added to an emulsion an aqueous solution obtained in the presence of an acid or a base, as described Japanese Patent Publication JP 44-23389B, 44-27555B and 57-22089B; or an aqueous solution or a colloidal dispersion prepared in the presence of a surfactant such as sodium dodecylbenzene sulfonate, as described in U.S. Pat. Nos. 3,822,135 and 4,006,025. Alternatively, a sensitizing dye which is dissolved in a solvent immiscible with water and then dispersed in water or a hydrophilic colloid, may be added to a silver halide emulsion. A dispersion in which a sensitizing dye is dispersed in a hydrophilic colloid may be added to an emulsion.

A pattern exposure of a silver salt containing layer to light may be performed by photo-mask area exposure or scanning exposure via a laser beam. Refraction type exposure using a lens or reflection type exposure using a reflection mirror may be employed and there may also be employed an exposure system such as contact exposure, proximity exposure, reduction projection exposure, or reflection projection exposure.

An exposure device may employ electromagnetic waves. Examples of such electromagnetic waves include light such as visible light or ultraviolet rays and radiation such as X-rays. A light source having a wavelength distribution may be used for exposure or there may be used a light source having a specific wavelength.

Examples of such a light source include scanning exposure using a cathode ray tube (CRT). A cathode ray tube exposure device is simple and compact, and is also low in cost, in which the optical axis or color can be easily controlled. In a cathode ray tube used for image exposure are employed various kinds of emitters exhibiting emission corresponding to a desired spectral region. For example, one or more of a red emitter, a green emitter and a blue emitter are mixedly used. The spectral region is not limited to the foregoing red, green and blue, and a phosphor emitting light in a yellow, orange, violet or infrared region is also usable. Specifically, a cathode ray tube emitting white light is often employed, in which emitters described above are mixedly used. An ultraviolet lamp is also preferable and a g-line, i-line or the like of a mercury lamp is employed.

Exposure using a laser beam preferably employs a scanning exposure system using a monochromatic high-density light, such as a gas laser, an emission diode, a semiconductor diode, or a second harmonic generator (SHG) by the combination of a semiconductor laser of a solid laser using a semiconductor laser as an exciting source with a non-linear optical crystal. There may also be usable KrF excimer laser, ArF excimer laser, $F_2$ laser, and the like. To make a system compact and low price, exposure is performed by using a semiconductor laser or a second harmonic generator (SHG) by the combination of a semiconductor laser or a solid laser using a semiconductor laser as an exciting source with a non-linear optical crystal. Specifically, to design a compact device of low price and long life, exposure is performed preferably by using a semiconductor laser.

Specific examples of a preferred laser light source include a blue semiconductor laser of a wavelength of 430 to 460 nm (presented by Nichia Kagaku Co., Ltd., 2001, March at Meeting of Oyobutsuri-gaku Kankei Rengo Koenkai), an approximately 530 nm green laser obtained by wavelength conversion of a semiconductor laser (oscillation wavelength of approximately 1060 nm) by a SHG crystal of $LiNbO_3$ having a reversed domain structure of a waveguide form, a red semiconductor laser of an approximately 685 nm wavelength (HITACHI, Type No. HL6738MG) and a red semiconductor laser of an approximately 650 nm wavelength (HITACHI, Type No. HL6501MG).

A photosensitive material is exposed and then subjected to chemical-developing treatment (also denoted simply as chemical development). Chemical development preferably is black-and-white development, not including a color developing agent.

A chemical developing solution may use hydroquinones such as hydroquinone, sodium hydroquinone sulfonate or chlorohydroquinone, as a developing agent. Such hydroquinones may be used in combination with a super-additive developing agent, such as pyrazolidones, for example, 1-phenyl-3-pyrazolidone, 1-phenyl-4,4-dimethyl-3-pyrazolidone, and 1-phenyl-4-methyl-4-hydroxymethyl-3-pyrazolidone; or N-methyl-p-aminophenol. Further, reductones such as ascorbic acid or iso-ascorbic acid, instead of hydroquinone, may preferably be used in combination with the foregoing superadditive developing agent.

A chemical developing solution may appropriately use a preservative such as sodium sulfite or potassium sulfite, a buffering agent such as sodium carbonate or potassium carbonate, or a development accelerator such as diethanolamine, triethanolamine or diethylaminopropanediol.

A chemical developing solution used for chemical development may contain an image improver to achieve enhanced image quality. Examples of such an image improver include a nitrogen-containing heterocyclic compound such as 1-pheny-5-mercaptotetrazole or 5-methylbenzotriazole.

After completing development, a fixing treatment (also denoted simply as fixing) is conducted to remove unexposed silver halide grains to achieve stabilization. The fixing treatment may employ the composition of a fixing solution used for photographic film or photographic paper using silver halide grains. A fixing solution used in the fixing treatment may use a fixing agent such as sodium thiosulfate potassium thiosulfate or ammonium thiosulfate. Aluminum sulfate or chromium sulfate may be used as a hardening agent in fixing. A preservative for a fixing agent may use sodium sulfite, potassium sulfite, ascorbic acid, or erythorbic acid, and citric acid or oxalic acid is also usable.

After completing a fixing treatment, it is preferred to conduct a washing treatment. Washing water used in the invention may contain a fungicide, such as N-methyl-isothiazole-3-one, N-methyl-isothiazole-5-chloro-3-one, N-methyl-isothiazole-4,5-dichloro-3-one,2-nitro-2-brom-3-hydroxypropanol, 2-methyl-4-chlorophenol or hydrogen peroxide.

After completing chemical development, a physical developing treatment (hereinafter, also denoted simply as physical development) is conducted. The physical developing treatment refers to a process in which other than developed silver formed of silver halide grains of a photosensitive material by chemical development, silver ions are newly supplied externally to reinforce the silver image, while developed silver acting a catalyst. Specific examples of a method of supplying silver ions from a physical developing solution include a method in which silver nitrate or the like is preliminarily dissolved in a physical developing solution to allow silver ions to exist therein and a method in which a silver halide solvent such as sodium thiosulfate or ammonium thiocyanate is dissolved in a physical developing solution and silver halide grains in unexposed areas are allowed to dissolve at the time of development to intensify development of silver halide grains having a latent image. In the invention, the former method is preferable.

In the invention, an oxidation treatment may be conducted after completing chemical development and/or physical development. Such an oxidation treatment ionizes unwanted metallic components to remove them through solution, rendering it feasible to enhance transmittance of film.

Such an oxidation treatment is performed by using an aqueous solution containing oxidizing agents known in the art, such as an aqueous Fe(III) ion-containing solution or an aqueous solution containing a peroxide such as hydrogen peroxide, a persulfate, a perborate, a perphosphate, a percarbonate, a perhalogenate, a hypohalogenate, a halogenate or organic peroxide compounds. The oxidation treatment may be conducted at any stage of from after completion of chemical development to after completion of physical development, and preferably at the stage after completing physical development.

After completion of chemical development or after completing physical development, a metal plating treatment may be conducted to achieve enhanced conductivity.

Such a metal plating treatment may employ various methods known in the art, and for example, an electrolytic metal plating and non-electrolytic metal plating may be conducted singly or in combination. Examples of a metal usable for plating include copper, nickel cobalt, tin, silver gold, platinum and various kinds of alloys. In the invention, an electrolytic copper sulfate plating treatment is preferred to achieve a mesh shape of the invention and its effect, in which the copper sulfate concentration of a plating bath is preferably from 60 to 120 g/l.

Further, after completing a metal plating treatment, a blackening treatment may be conducted to prevent outside light reflection on the film surface. Such a blackening treatment is not specifically restricted and known methods may be appropriately employed singly or in their combinations. In the case when the uppermost surface of a conductive pattern is formed of metallic copper, examples of a blackening treatment include a oxidation treatment by immersion in an aqueous solution containing sodium chlorite, sodium hydroxide or trisodium phosphate and a blackening treatment by immersion in an aqueous solution containing copper pyrophosphate, potassium pyrophosphate and ammonia. In the case when the uppermost surface of a conductive pattern is formed of nickel-phosphorus alloy film, immersion in an acidic blackening treatment solution containing copper (II) chloride or copper (II) sulfate, nickel chloride or nickel sulfate and hydrochloric acid is preferably employed.

A blackening treatment can also be performed by minute-roughening of the surface, other than the foregoing methods but a blackening treatment by oxidation is preferred in terms of maintaining high conductivity rather than the minute-roughening of the surface.

Transparent Conductive Material

A transparent conductive material related to the invention is featured in that it contains an electrically conductive polymer and at least one of an electrically conductive fiber and electrically conductive metal.

Conductive Polymer

A conductive polymer usable in the invention preferably is an organic polymer formed of a backbone constituted of a π-conjugated system. Examples of such an organic polymer include polypyrroles, polythiophenes, polyacetylenes, polyphenylenes, polyphenylene-vinylenes, polyanilines, polyacenes, poluthiophenes, polyacenes, polythiophene-vinylenes, and their copolymers. Of these, a polymer selected from polypyrrole, polythiophene, poly(N-methylpyrrole), poly(3-methylthiophene), poly(3-methoxythiophene) and poly(3,4-ethylenedioxythiophene) or their copolymer are appropriately employed. Specifically, polypyrrole, polythiophene and poly(3,4-ethylenedioxythiophene) are preferred.

Further, a conductive polymer usable in the invention may contain a polyanion or other dopants. Examples of a polyanion include a polymeric carboxylic acid and a polymeric sulfonate. Specific examples of a polymeric carboxylic acid include poly(acrylic acid), poly(methacrylic acid), and poly (maleic acid). Specific examples of a polymeric sulfonic acid include poly(styrenesulfonic acid) and poly(vinylsulfonic acid). This polymeric carboxylic acid or polymeric sulfonic acid may be a copolymer of a vinylcarboxylic acid or a vinylsulfonic acid with a polymerizable low-molecular weight compound such as acrylates or styrene. Specific examples thereof include poly(vinylsulfonic acid), poly(styrenesulfonic acid), poly(allysulfonic acid), poly(acrylsulfonic acid), poly(methacrylsulfonic acid), poly-2-acrylamido-2-methylpropanesulfonic acid, polyisoprenesulfonic acid, polyvinylcarboxylic acid, poly(styrenecarboxylic acid), polya(allylcarboxylic acid), poly(acrylcarboxylic acid), poly(methacrylcarboxylic acid), poly-2-acrylamido-2-methyl-propanecarboxylic acid, and polyisoprenecarboxylic acid. These may be a single polymer or a copolymer. Of these are preferred polyanions, poly(acrylsulfonic acid), poly(styrenesulfonic acid), and their partial or whole metal salts. Specifically, poly(styrenesulfonic acid) is more preferred. The number average molecular weight of such a polyanion is preferably from 1,000 to 2,000,000 and more preferably from 2,000 to 500,000.

The ratio of a polyanion to a conductive polymer is preferably 0.5 to 10 g of a polyanion to 1 g of a conductive polymer in terms of film strength and conductivity, and more preferably 1 to 5 g.

Other dopants may be a donor one or acceptor one if it is capable of subjecting a conductive polymer to oxidation reduction. Examples of such a donor dopant include an alkali metal such as sodium or potassium, an alkaline earth metal such as calcium or magnesium, and a quaternary amine compound such as tetramethylammonium, tetraethylammonium, tetrapropylammonium, tetrabutylammonium, methyltriethylammmonium or dime thyldiethylammnoim. Examples of an acceptor dopant include a halogen compound, a Lewis acid, a protonic acid, an organic cyano compound, an organic metal compound, a fullerene, a hydrogenated fullerene, a hydroxylated fullerene, a carboxylated fullerene and a sulfonated fullerene.

Further, it is preferred to add a polar organic solvent to the conductive polymer solution, such as diethylene glycol, triethylene glycol, tetraethylene glycol, dimethylformamide or dimethylsulfoxide in a small amount not to adversely affect durability of the transparent conductive layer. The addition amount of a polar organic solvent is preferably from 0.5 to 50%, and more preferably from 1 to 10%, based on aqueous 1% π-conjugated polymer solution.

Conductive Fiber

In the invention, a conductive fiber is one which exhibits electrical conductivity and has a shape of a length being sufficiently greater than its width, in which the ratio of length to width (aspect ratio) is preferably not less than 5, and more preferably not less than 20. The shape includes a hollow tube form, a wire form and a fiber form. Specific examples thereof include a carbon nanotube, a carbon fiber and a metal nanowire.

A carbon nanotube, as a conductive fiber related to the invention, is generally known and is a carbon fiber material having a form in which a graphite-form carbon atomic face of some atomic layers thickness (graphen sheet) is rolled in a cylindrical form. Such carbon nanotubes are mainly classified into a single wall nanotube (SWNT) and a multi-wall nanotube (MWNT) from the number of constituting layers, and are also classified into a chiral type, a zig-zag type and an armchair type from the difference in structure of graphite sheet, and various kinds of ones are known. Any type of carbon nanotube which is called nanotube is usable in the invention. Plural nanotubes may be used in combination.

A carbon nanotube used in the invention preferably is a single wall nanotube exhibiting a large aspect ratio, that is, a thin and long one. Examples of such a carbon nanotube include ones exhibiting an aspect ratio of $10^3$ or more and preferably $10^4$ or more. The length of a carbon nanotube is usually not less than 1 μm, preferably not less than 50 μm and more preferably not less than 500 μm, and the upper limit is not specifically limited but is, for example, about 10 mm.

With respect to outer diameter, there is known an extremely minute carbon nanotube having an outer diameter in the nm order. Preferably, a carbon nanotube is surface-treated with an organic compound and specifically, it is preferred to allow every primary particle to be enhanced for dispersibility by using a surfactant.

A production method of carbon nanotubes used in the invention is not specifically limited. Specific examples thereof include catalytic hydrogen reduction of carbon dioxide, an arc discharge method, a laser distillation method, a CVD method, a gas phase growth method and a HiPco method in which carbon monoxide is allowed to react together with a iron catalyst under high temperature and high pressure to perform growth in a gas phase. A highly-purified carbon nanotube which has been purified by various methods such as a washing method, a centrifugal separation method, filtration method, an oxidation method, a chromatography method or the like to remove byproducts or residues such as a catalyst metal, sufficiently achieves various functions and is preferred.

Metal Nanowire

An element which exhibits an electric conductivity of not less than $1 \times 10^6$ S/m in a bulk state is usable as a metal element for a metal nanowire relating to the invention. Preferred metal elements used for a metal nanowire include Ag, Cu, Au, Al, Rh, Ir, Co, Zn, Ni, In, Fe, Pd, Pt, Sn, and Ti. In the invention, at least two kinds of metal nanowires may be used in combination, and it is preferred to use an element selected from the group consisting of Ag, Cu, Au, Al, and Co in terms of conductivity.

In the invention, the production method of a metal nanowire is not specifically limited and there may be employed known methods of a liquid phase process or a gas phase process. Specifically, an Ag nanowire can be synthesized preferably by a liquid process in which a silver salt such as silver nitrate is reduced in a polyol such as ethylene glycol or polyvinyl pyrrolidone, whereby uniform-shaped Ag nanowires can be produced in large amounts. Synthesis methods are described in, for example, Xia.Y, et al., Chem. Mater., vol. 14, 2002, pages 4736-4745; Xia. Y, et al., Nanoletters. Vol. 3, 2003, pages 955-960.

In the invention, the average diameter of a metal nanowire is preferably not more than 200 nm in terms of transparency, and more preferably not less than 10 nm in terms of conductivity. An average diameter of not more than 200 nm can reduce influence of light scattering and a smaller average diameter preferably inhibits a lowering of light transmittance or haze deterioration. When an average diameter is not less than 10 nm, function as an electric conductor has significantly come into effect and a larger average diameter results in enhanced conductivity. Accordingly, an average diameter is more preferably from 20 to 150 nm, and still more preferably from 40 to 150 nm.

In the invention, the average length of a metal nanowire is preferably not less than 1 μm in term of conductivity and not more than 100 μm in view of influence of coagulation on transparence, more preferably from 1 to 50 μm, and still more preferably from 3 to 50 μm.

In the invention, the average diameter and the average length of the foregoing metal nanowire can be determined in such a manner that electronmicrographs of a sufficient number of nanowires are taken using SEM or TEM to determine an arithmetic average of measured values of nanowire images. The length of a nanowire should be measured in the state of being stretched but really, a nanowire is often bent, so that a projection diameter and a projection area are calculated from an electronmicrograph by using an image analyzing apparatus and the length is determined based on assumption of a circular cylinder [length=(projection area)/(projection diameter)]. The number of nanowires to be measured is preferably not less than 100 and more preferably not less than 300.

Conductive Metal

As an electrically conductive metal is cited a base metal oxide which has been oxidized by metal nanoparticles or an electrically conductive polymer and enclosed into the conductive polymer as an oxide.

Metal Nanoparticle

An metal element forming the metal nanoparticle related to the invention is preferably an element selected from the group of gold, platinum, silver, copper, zinc, palladium, rhodium, iridium, ruthenium, nickel, aluminum, tin, lead, carbon and titanium. A compound containing these elements may be included.

Gold, platinum, silver, copper, zinc, palladium, rhodium, iridium and ruthenium are preferred.

A metal nanoparticle related to the invention is preferably transparent. In the invention, the transparent metal nanoparticle refers to a metal nanoparticle in which surface plasmon absorption disappears or surface plasmon absorption is wavelength-shifted, that is, the absorption wavelength (or absorption peak wavelength) is shifted outside the visible light wavelength region (380 to 780 nm), resulting in no plasmon absorption in the visible light region and the overall light transmittance is not less than 60%.

In the invention, production of metal nanoparticles is not specifically restricted to a specific method and is performed by appropriate methods known in the art, such as a liquid phase process or gas phase process. Examples of a liquid phase process usable in the invention include a chemical liquid phase process such as a liquid phase reduction method, an alkoxide method, a reversed micelle method, a hot soap method or a hydrothermal reaction and a physical liquid phase process such as a spray drying method. Examples of a gas phase process usable in the invention include a chemical vapor deposition (CVD) and a physical vapor deposition (PVD) method.

In general, surface plasmon absorption of metal nanoparticles varies depending of size or shape of the nanoparticles even if they are an identical element. In gold nanoparticles, for example, it is known that the peak wavelength near 530 nm shifts to the loner wavelength side as the particle size increases. It is also known that bar-form gold nanorods exhibit specific absorption in the visible to near-infrared region, depending on the difference in a ratio of long axis to short axis (aspect ratio). In the invention, a method of allowing surface plasmon absorption of metal nanoparticles to disappear or a method of shifting the wavelength of the surface plasmon absorption, that is, shifting an absorption wavelength region (or absorption peak wavelength) to outside the visible wavelength region, is not restricted and complexing with an organic compound or combining at least two metals is preferably applicable. Complexing with an organic compound include, for example, a method of partially covering a metal nanoparticle with a π-conjugated polymer and a method of partially modifying the metal nanoparticle surface with a compound containing a thiol group. Combining at least two metals includes a method of partially or completely covering a metal nanoparticle with different metals.

Further, to allow metal nanoparticles to be homogeneously dispersed within a conductive polymer, metal nanoparticles may be formed simultaneously with polymerization of a conductive polymer by using a metal complex as an oxidative polymerization initiator to form the conductive polymer. Preferred examples of such a metal complex include chloroauric acid, platonic chloride, palladium chloride, rhodium chloride, a hexachloroiridium salt. Among these are specifically preferred chloroauric acid and platonic chloride. To accelerate completion of a polymerization reaction of a conductive polymer, other oxidative polymerization initiators such as ammonium persulfate or iron chloride may be added in addition to a metal complex.

In the invention, the average particle size of metal nanoparticles is preferably from 2 to 100 nm, more preferably from 3 to 80 nm and still more preferably from 5 to 50 nm. A particle size of not more than 100 nm results in reduced influence of light scattering, and a smaller particle size is preferable to inhibit a lowering of light transmittance or deterioration due to haze. Further, a particle size of not less than 3 nm is preferred in terms of electric conductivity and a particle size of not less than 5 nm is more preferred. When at least two kinds of metal nanoparticles are combined, the average particle of at least one kind of nanoparticles before being combined and/or the average particle size of the nanoparticles after being combined is preferably not less than 3 nm, and more preferably not less than 5 nm.

In the invention, the average particle size of the foregoing metal nanoparticles needs to be fundamentally determined in three dimensions but it is difficult with such extremely fine particles and it really has to be evaluated in a two-dimensional image; accordingly, it is preferred to be determined in such a manner that a large number of picture-taking scenes are photographed by using a transmission electron microscope (TEM) and averaged out. Thus, in the invention, a sufficient number of particles are electron-photographed by using a TEM and the sectional area of the particles is measured, and the diameter obtained when the measured value is converted to a corresponding circle is defined as the particle size and an arithmetic average thereof is defined as an average particle size. The number of particles to be photographed in TEM is preferably not less than 50 particles and more preferably from 100 to 300 particles.

In the invention, the volume fraction of metal nanoparticles in a transparent conductive film of a transparent conductive element is preferably not less than 10% and not more than 90%, and more preferably not less than 20% and not more than 80%. When the volume fraction of metal nanoparticles is not less than 10%, an improvement of conductivity on addition of metal particles has come into effect and enhanced conductivity is achieved as the volume fraction increases. On the other hand, the volume fraction of metal nanoparticles is preferably not more than 90% and more preferably not more than 80%.

Conductive Polymer Modified with Base Metal

In the invention, the expression, "modification with a base metal" represents that when an electrically conductive polymer and a base metal are allowed to stand for some days, while being in contact with each other, the base metal is oxidized by the conductive polymer and an oxide of the base metal is introduced into the conductive polymer. Examples of such a method of bringing the conductive polymer into contact with the base metal include a method in which a conductive polymer film is coated and on the coated film surface, a thin base metal film is brought into contact or is deposited by a vapor deposition or a sputtering method, a plating method or an electrodeposition method.

Specific examples of a base metal usable in the invention include iron, copper, nickel, aluminum, lead, zinc, tin, tungsten, molybdenum, tantalum, magnesium, cobalt, bismuth, cadmium, titanium, zirconium, antimony, manganese, beryllium, chromium, germanium, vanadium, gallium, hafnium, indium, niobium, rhenium and thallium. Of these are preferably used aluminum, titanium, indium, cadmium, manganese, iron, copper, tin, lead, and antimony.

The foregoing conductive fiber and conductive metal may be used singly or in their combinations. Further, they may be combined with modification by use of a base metal. In that case, using a conductive polymer solution mixed with metal nanoparticles or a conductive fiber, or using a metal complex as an oxidative polymerization initiator, a conductive polymer solution is coated and dried, in which formation of metal nanoparticles is performed simultaneously with formation of the conductive polymer, whereby modification with a base metal is performed.

Ionic Liquid

The transparent conductive material of the invention may contain an ionic liquid. Such an ionic liquid is called a cold molten salt or simply a molten salt, which is a salt exhibiting a molten state over a broad temperature range including ordinary temperature (room temperature)

Various kinds of ionic liquid are usable in the invention, and one which is liquid and stable at ordinary temperature is preferred and one which is compatible with a conductive polymer used for a conductive film or various solvents is also preferred. Examples of ionic liquid include ones which are insoluble in water (hydrophobic ionic liquid) and in cases when there is concern with respect to instability in moisture or corrosion of metals used in the surroundings of an element, the use of such hydrophobic ionic liquid is preferred.

Examples of preferred ionic liquid used in the invention include compounds comprised of a cation (preferably, a quaternary ammonium ion) and an anion ($X^-$), represented by the following formulas (I) to (IV):

Formula (I)

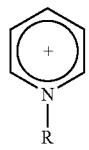

Formula (II)

$[NR_xH_{4-x}]^+$

Formula (III)

$[PR_xH_{4-x}]^+$

Formula (IV)

In the foregoing formulas (I) to (IV), R represents a straight chain or branched alkyl group having carbon atoms of not more than 10 or a straight chain or branched alkyl group containing an ether linkage and having a total number of carbon and oxygen atoms of 3 to 12; $R^1$ represents a hydrogen atom or a straight chain or branched alkyl group having carbon atoms of 1 to 4, which is preferably a methyl group. In the formula (I), R and $R^1$ preferably are not identical. In the formulas (III) and (IV), X is an integer of 1 to 4.

In the foregoing formulas, examples of a straight chain or branched alkyl group containing an ether linkage and having a total number of carbon and oxygen atoms of 3 to 12 include $CH_2OCH_3$, $(CH_2)_p(OCH_2CH_2)_qOR^2$ (where p is an integer of 1 to 4, and q is an integer of 1 to 4 and $R^2$ is $CH_3$ or $C_2H_5$).

Specific examples of a compound of the formula (I) include 1-ethyl-3-methylimidazolium, 1-hexyl-3-methylimidazolium and 1-butyl-3-methylimidazolium.

Specific examples of a compound of the formula (II) include 1-ethylpyridinium, 1-butylpyridinium and 1-hexylpyridinium.

Specific examples of a compound of the formula (III) include N,N,N-trimethyl-N-propylammonium and N-methyl-N-propylpiperidinium.

Specific examples of a compound of the formula (IV) include N,N,N-trimethyl-N-propylphosphonium.

Specific examples of an anion ($X^-$) include tetrafluoroborate, hexafluorophosphate, bis(trifluoromethylsulfonyl)imido acid, perchlorate, tris(trifluoromethylsulfonyl)carbonate, trifluoromethanesulfonate, dicyanamide, trifluoroacetate, organic carboxylate and a halide ion.

The ionic liquid relating to the invention is not limited to the foregoing combinations but there is usable any ionic liquid exhibiting a dielectric constant of not more than 0.1 S/m.

The ionic liquid relating to the invention is a substance combining a cation and an anion and can be synthesized by a method known in the art, for example, an anion exchange method, an acid ester method or a neutralization method.

Other Additives

The electrically conductive composition relating to the invention may contain appropriate additives other than the above-described components. Specific examples of such additives include a surfactant, an organic solvent, an ultraviolet absorber, an antioxidant, a deterioration inhibiting agent, a PH adjusting agent, a polymerization inhibitor, a surface-modifying agent, a defoaming agent, a plasticizer and an anti-fungal agent. These may be used singly or in combination.

Examples of a surfactant include an anionic surfactant, a cationic surfactant, an amphoteric surfactant and a non-ionic surfactant, as are generally known and any of these may be used. In the invention, when forming an electrically conductive film, the use of an aqueous solvent is sometimes advantageous. In such a case, it is also a preferred embodiment to use a polycondensation type aromatic hydrocarbon surfactant, a polymerization type aromatic hydrocarbon surfactant, an aromatic hydrocarbon non-ionic surfactant, and a combination of an aromatic hydrocarbon non-ionic surfactant and a non-ionic surfactant.

Specific examples of a surfactant are shown below, but the invention is by no means restricted to these. Examples of an anionic surfactant include an alkylsulfonic acid, an alkylbenzene sulfonic acid, an alkylcarboxylic acid, an alkylnaphthalene sulfonic acid, an α-olefin sulfonic acid, a dialkylsulfosuccinic acid, an α-sulfonated carboxylic acid, N-methyl-N-oleyltaurine, a petroleum sulfonic acid, an alkyl sulfonate, a sulfonated fat, a polyoxyethylene alkyl ether sulfate, a polyoxyethylene styrenated phenyl ether, an alkylphosphoric acid, a polyoxyethylene alkyl ether phosphate, a polyoxyethylene alkyiphenyl ether phosphate, a naphthalenesulfonic acid formalin condensation product, a methylnaphthalenesulfonic acid formalin condensation product, a butylnaphthalene/naphthalenesulfonic acid formalin condensation product, a naphthol methylenesulfonic acid formalin condensation product, a creosote oil sulfonic acid formalin condensation product, a naphthalenesulfonic acid formaldehyde condensation product, poly(styrenesulfonic acid), and salts of these.

Specific examples of a cationic surfactant include primary to tertiary aliphatic amines, a quaternary ammonium, a tetraalkylammonium, a trialkylbenzylammonium alkylpyridium, a 2-alkyl-1-alkyl-1-hydroxyethylimidazolium, an N,N-dialkylmorpholium, a polyethylene polyamine carboxylic acid amide, a polyethylene polyamine carboxylic acid amide, a quaternary ammonium of a condensation product of a polyethylene polyamine carboxylic acid amide and urea, and salts of these.

Specific examples of an amphoteric surfactant include betaines such as N,N-dimethyl-N-alkyl-carboxymethylammonium betaine, a N,N,N-trialkyl-N-sulfoalkyleneammonium sulfuric acid ester betaine, 2-alkyl-1-carboxymethyl-1-hydroxyethylimidazolium betain; and aminocarboxylic acids such as N,N-dialkylaminoalkylenecarboxylic acid salt.

Specific examples of a nonionic surfactant include a polyoxyethylene alkyl ether, polyoxyethylene alkylphenyl ether, a polyoxyethylene polystyrylphenyl ether, polyoxyethylene-polyoxypropylene glycol, polyoxyethylene-polyoxypropylene alkyl ether, a polyhydric alcohol carboxylic acid partial ester, a polyoxyethylene carboxylic acid ester a polyglycerin carboxylic acid ester, a polyoxyethylene-modified castor oil, a carboxylic acid dimethanol amide, a polyoxyethylene alkylamine, a triethanolamine carboxylic acid partial ester, and a trialylamine oxide.

There may also be used fluorinated surfactants such as a fluoroalkylcarboxylic acid, a perfluoroalkylcarboxylic acid, a perfluoroalkylbenzenesulfonic acid, and a perfluoroalkylpolyoxyethylene ethanol.

The foregoing alkyl group preferably has 1 to 24 carbon atoms and more preferably, 3 to 18 carbon atoms. A salt counter ion may be any one of alkali metals, alkaline earth metals and amines and a Na salt is preferable in terms of availability.

A surfactant content may not uniformly be defined, depending on a molecular weight or capability of a surfactant to be used but preferably is approximately 0.5 to 500% by mass, more preferably 1 to 100% by mass and still more preferably 1 to 100% by mass.

It is preferred to use the combination of the above-described polycondensation type aromatic hydrocarbon surfactant and/or polymerization type aromatic hydrocarbon surfactant (A), and an aromatic hydrocarbon nonionic surfactant and/or aromatic hydrocarbon nonionic surfactant and an ionic surfactant (B), in which the ratio of (A) to (B), (A)/(B) is not specifically limited but preferably from 99.9/0.1 to 70/30. The ratio by mass of an aromatic hydrocarbon nonionic surfactant to an ionic surfactant (aromatic hydrocarbon nonionic surfactant/ionic surfactant is preferably from 99.1/0.1 to 50/50.

With respect to the kind of a solvent, a hydrophilic solvent or a hydrophobic solvent may arbitrarily be usable but a hydrophilic solvent is preferably used in terms of solubility of a conductive polymer, handling of conductive composition and applicability of aqueous-coating in film formation.

Examples of such a hydrophilic solvent include water, alcohols such as methanol ethanol, isopropyl alcohol butanol and the like; ketones such as acetone, methyl ethyl ketone, ethyl isobutyl ketone, methyl isobutyl ketone and the like; ethylene glycols such as ethylene glycol, ethylene glycol methyl ether, ethylene glycol mono-n-propyl ether and the like; propylene glycols such as propylene glycol, propylene glycol methyl ether, propylene glycol ethyl ether, propylene glycol butyl ether, propylene glycol propyl ether and the like; ethers such as tetrahydrofuran or the like; amides such as dimethylformamide, dimethylacetoamide and the like; pyrrolidones such as N-methylpyrrolidone, N-ethylpyrrolidone and the like; esters such as methyl acetate, ethyl acetate, isopropyl acetate, butyl acetate, propionic acid methyl ester and the like; hydroxyesters such as dimethyl sulfoxide, γ-butyl lactone, methyl lactate, ethyl lactate, methyl β-methoxy-isobutyrate, methyl α-hydroxyisobutyrate and the like; anilines such aniline, N-methylaniline and the like; and carbonates such as ethylene carbonate, propylene carbonate, dimethylcarbonate, diethylcarbonate, methyl ethyl carbonate, propylene carbonate, butylene carbonate and the like.

Examples of a hydrophobic solvent include ketones having 5 to 10 carbon atoms such as 4-methylpentane-2-one and the like; halogenated hydrocarbons such as chloroform, methylene chloride and the like; aromatic hydrocarbons such as toluene, benzene, xylene and the like; and aliphatic or alicyclic hydrocarbons such as hexane, cyclohexane and the like.

Formation Method of Transparent Conductive Material Layer

In the invention, a method of allowing a transparent conductive material to be layered on a transparent film substrate to form a transparent conductive element preferably employs a liquid phase layer-forming method such as a coating method or a printing method in terms of compatibility of high productivity and production cost reduction and environmental load reduction. Specific examples of a coating method include a roll coating method, a bar coating method, a dip coating method, a spin coating method, a casting method, a die coating method, a blade coating method, a bar coating method, a gravure coating method, a curtain coating method, a spray coating method, and a doctor knife coating method. Specific examples of a printing method include a letterpress (typographic) printing method, a stencil (screen) printing method, a lithographic (offset) printing method, an intaglio gravure) printing method, a spray printing method and ink-jet printing method. After forming a transparent conductive layer, a drying treatment is appropriately applied thereto. Drying conditions are not specifically restricted but it is preferred to perform drying within a temperature range, which does not damage the transparent resin support or the transparent conductive layer.

Electronic Paper

A highly transparent, electrically conductive film of enhanced flexibility, used for a liquid crystal display, an electroluminescence display, a plasma display, an electrochromic display, a solar cell, electronic paper, a touch panel and the like and a production method thereof can be provided according to the invention; but in the following, there will be described electronic paper of an electrodeposition system.

Electronic paper of an electrodeposition system (which is hereinafter also denoted simply as ED electronic paper) is a system employing dissolution and deposition of a metal or a metal salt and can be driven at a relatively low voltage of not more than 3 V, exhibiting advantages such as a simple cell structure and superiority in black-and-white contrast or black quality.

There will be described a typical example of electronic paper, in which an electrolyte layer containing silver or a compound including silver in the chemical structure is provided between opposed electrodes, and the opposed electrodes are driven so that dissolution and deposition of silver is caused.

The compound including silver in the chemical structure is a generic name of compounds such as silver oxide, silver sulfide, metallic silver, colloidal silver particles, a silver halide, a silver complex compound, and silver ions. Nothing is considered with respect to phase state species such as a solid state, a state of dissolution in liquid and a gas state and charged state species such as being neutral, anionic or cationic.

FIG. 1 illustrates a sectional view of the ED electronic paper. As shown in FIG. 1, an electrolyte layer 2 is held between a transparent conductive film 1 and a silver electrode 3 as an opposed electrode. The display state is varied utilizing differences in optical properties of the silver-containing compound such as transmission and absorption of light. The optical properties of silver-including compound is changed by dissolving silver in the electrolyte layer 2 or depositing silver from the electrolyte layer 2 by applying voltage or current through the paired electrodes 1 from power source 4.

In the ED electronic paper, the electrolyte layer contains a mercapto compound and meets the following expression:

$$2 \leq [\text{—SH}]/[\text{Ag}] \leq 10$$

wherein [—SH] represents a total molar number of a sulfur atom of a mercapto group of the electrolyte layer and [—SH] represents a total molar number of silver contained in the electrolyte layer. In the invention, the more preferred range is $2.5 \leq [\text{—SH}]/[\text{Ag}] \leq 5$. In the invention, the sulfur atom of a mercapto group of the electrolyte layer includes a sulfur atom existing in the form of $S^-$ or silver sulfide, in addition to a mercapto group.

The mercapto compound preferably is one in which the molecular weight preferably meets the following requirement in terms of smell and solubility:

$$50 \leq \text{molecular weight} \leq 149.$$

Inclusion of plural kinds of species achieves an enhanced silver solution concentration and prevention of silver deposition at a low temperature of an electrolyte solution.

An electrolyte layer preferably contains at least one solvent selected from the group consisting of propylene carbonate, ethylene carbonate, ethylmethyl carbonate, diethyl carbonate, dimethyl carbonate, butylene carbonate, γ-butyrolactone, tetramethylurea, sulfolane, dimethyl sulfoxide, 1,3-dimethyl-2-imidazolidinone, 2-(N-methyl)-2-pyrrolidinone, hexamethylphosphortriamide, N-methylpropioneamide, N,N-dimethylacetamide, N-methylacetamide, N,N-dimethylformamide, N-methylformamide, butyronitrile, propionitrile, acetonitrile, acetylacetone, 4-methyl-2-pentanone, 2-butanol, 1-butanol, 2-propanol, 1-propanol, ethanol, methanol, acetic anhydride, ethyl acetate, ethyl propionate, dimethoxy ethane, diethoxyfuran, tetrahydrofuran, ethylene glycol, diethylene glycol, triethylene glycol monobutyl ether, and water.

Of solvents described above, it is preferred to contain at least one solvent exhibiting a freezing point of not more than −20° C. and a boiling point of not less than 120° C. Examples of such a solvent exhibiting a freezing point of not more than −20° C. and a boiling point of not less than 120° C. include propylene carbonate, ethylene carbonate, ethylmethyl carbonate, diethyl carbonate, dimethyl carbonate, γ-butyrolactone, 2-(N-methyl)-2-pyrrolidinone, N-methylpropioneamide, and N,N-dimethylformamide.

Other solvents usable in the electrolyte layer include those shown in, for example, J. A. Riddick, W. B. Bunger, T. K. Sakano, "Organic Solvents", 4th ed., John Wiley & Sons (1986), Y. Marcus, "Ion Solvation", John Wiley & Sons (1985), C. Reichardt, "Solvents and Solvent Effects in Chemistry", 2nd ed., VCH (1988), G. J. Janz, R. P. T. Tomkins, "Nonaqueous Electorlytes Handbook", Vol. 1, Academic Press (1972).

A liquid electrolyte can contain therein compounds as below. Listed as potassium compounds are KCl, KI, and KBr; listed as lithium compounds are $LiBF_4$, $LiClO_4$, $LiPF_6$, and $LiCF_3SO_3$; while listed as tetraalkylammonium compounds are tetraethylammonium perchlorate, tetrabutylammonium perchlorate, tetraethylammonim borofluoride, tetrabutylammonium borofluoride, and tetrabutylammonium halide. In addition, there are preferably used fused salt electrolyte compositions described in paragraphs [0062]-[0081] of JP 2003-187881A. Further, there are also usable compounds which form oxidation-reduction pairs such as $I^-/I_3^-$, $Br^-/Br_3^-$ and quinone/hydroquinone.

Further, a solid electrolyte can contain therein compounds exhibiting electronic or ionic conductivity, as described below. Examples of such compounds include fluorinated vinyl based polymers containing perfluorosulfonic acid, polythiophene, polyaniline, polypyrrole, triphenylamines, polyvinylcarbazoles, polymethylphenylsilanes, calcogenides such as $Cu_2S$, $Ag_2S$, $Cu_2Se$, and $AgCrSe_2$, fluorine compounds such as $CaF_2$, $PbF_2$, $SrF_2$, $LaF_3$, $TlSn_2F_5$, and $CeF_3$, lithium salts such as $Li_2SO_4$, $Li_4SiO_4$ and $Li_3PO_4$ and compounds such as $ZrO_2$, $CaO$, $Cd_2O_3$, $HfO_2$, $Y_2O_3$, $Nb_2O_5$, $WO_3$, $Bi_2O_3$, $AgBr$, $AgI$, $CuCl$, $CuBr$, $CuBr$, $CuI$, $LiI$, $LiBr$, $LiCl$, $LiAlCl_4$, $LiAlF_4$, $AgSBr$, $C_5H_5NHAg_5I_6$, $Rb_4Cu_{16}I_7Cl_{13}$, $Rb_3Cu_7Cl_{10}$, $LiN$, $Li_5NI_2$, and $Li_6NBr_3$.

There may be employed, as supporting electrolytes, electrolytes in gel form. When electrolytes are nonaqueous, there may be used oil gelling agents described in JP 11-185836A, paragraphs [0057]-[0059].

The electrolyte layer of the invention preferably contains white particles. Examples of white particles include titanium dioxide (an anatase type or a rutile type), barium sulfate, calcium carbonate, aluminum oxide, zinc oxide, magnesium oxide, zinc hydroxide, magnesium hydroxide, magnesium phosphate, magnesium hydrogenphosphate, alkaline earth metal salts, talc, kaolin, zeolite, acid clay, glass, as well as organic compounds such as polyethylene, polystyrene, acryl resins, ionomers, ethylene-vinyl acetate copolymer resins, benzoguanamine resins, urea-formalin resins, melamine-formalin resins and polyamide resins. These particles may be used singly or in combination. Also, the particles may contain voids to alter the refractive index.

Of these particles, there are preferably employed titanium dioxide, zinc oxide, and zinc hydroxide. More preferably are employed titanium dioxide which has been subjected to a surface treatment employing inorganic oxides (e.g., $Al_2O_3$, $AlO(OH)$, $SiO_2$). In addition to such surface treatments, titanium dioxide particles may be subjected to a treatment employing organic compounds such as trimethylolethane or triethanolamine acetic acid salts.

Of these white particulate materials, titanium oxide or zinc oxide are preferably used in terms of prevention of coloring at a relatively high temperature or reflectance of the display element which is influenced by the refractive index.

There may be used thickening agents in the electrolyte layer. Examples thereof include gelatin, gum Arabic, poly (vinyl alcohol), hydroxyethyl cellulose, hydroxypropyl cellulose, cellulose acetate, cellulose acetate butyrate, poly(vinylpyrrolidone), poly(alkylene glycol), casein, starch, poly (acrylic acid), poly(methylmethacrylic acid), poly(vinyl chloride), poly(methacrylic acid), copoly(styrene-maleic anhydride), copoly(styrene-acrylonitrile), copoly(styrene-butadiene), poly(vinyl acetals) (for example, poly(vinyl formal), poly(vinyl butyral)), poly(vinyl esters), poly(urethanes), phenoxy resins, poly(vinylidene chloride), poly (epoxides), poly(carbonates), polyvinyl acetate), cellulose esters, poly(amides), as well as polyvinyl butyral, cellulose acetate, cellulose acetate butyrate, polyester, polycarbonate, polyacrylic acid, and polyurethane as a transparent hydrophobic binder.

These thickening agents may be used in combination. There are further cited the compounds described on pages 71-75 of JP-A No. 64-13546. Of these, polyvinyl alcohols, polyvinylpyrrolidones, hydroxypropyl celluloses, and polyalkylene glycols are preferably used in terms of compatibility with various types of additives and enhancement of dispersion stability of white particles.

Auxiliary layer which may be provided between electrodes include a protective layer, a filter layer, an antihalation layer, a cross-over light cutting layer, and a backing layer. These auxiliary layers may contain chemical sensitizers, noble metal sensitizers, photosensitive dyes, supersensitizers, high boiling point solvents, antifoggants, stabilizers, development inhibitors, bleach accelerators, fixing accelerators, color mixing inhibitors, formalin scavengers, toners, hardeners, surface active agents, thickening agents, plasticizers, lubricants, UV absorbents, anti-irradiation dyes, filter light absorbing dyes, anti-mold, polymer latexes, heavy metals, antistatic agents, and matting agents.

The additives described above are detailed in Research Disclosure (hereinafter denoted simply as RD) Volume 176 Item/17643 (December 1978), RD Volume 184 Item/18431 (August 1979), DR Volume 187 Item/18716 (November 1979), and RD Volume 308 Item/308119 (December 1989).

Types of compounds cited in RD are listed below.

| Additives | RD 17643 | | RD 18716 | | RD 308119 | |
|---|---|---|---|---|---|---|
| | Page | Section | Page | Section | Page | Section |
| Chemical Sensitizers | 23 | III | 648 | right top | 96 | III |
| Sensitizing Dyes | 23 | IV | 648-649 | | 996-8 | IV |
| Desensitizing Dyes | 23 | IV | | | 998 | IV |
| Dyes | 25-26 | VIII | 649-650 | | 1003 | VIII |
| Development Accelerators | 29 | XXI | 648 | right top | | |
| Antifoggant Stabilizer | 24 | IV | 649 | right top | 1006-7 | VI |
| Optical Brightening Agents | 24 | V | | | 998 | V |
| Hardeners | 26 | X | 651 | left | 1004-5 | X |
| Surfactants | 26-7 | XI | 650 | right | 1005-6 | XI |
| Antistatic Agents | 27 | XII | 650 | right | 1006-7 | XIII |
| Plasticizers | 27 | XII | 650 | right | 1006 | XII |
| Lubricants | 27 | XII | | | | |
| Matting Agents | 28 | XVI | 650 | right | 1008-9 | XVI |
| Binders | 26 | XXII | | | 1003-4 | IX |
| Supports | 28 | XVII | | | 1009 | XVII |

EXAMPLES

The present invention will be further described with reference to examples but the invention is by no means limited to these. Unless otherwise noted, the expression "%" represents % by mass.

Preparation of Metal Conductive Pattern

Metal Conductive Pattern A:

The following solution A in a reaction vessel was adjusted to a pH of 2.95 with a nitric acid solution (concentration: 6%), while being maintained at 34° C. and stirred by a stirring device described in JP 62-160128A. Subsequently, solutions B and C were added at a constant flow rate over 8 min. 6 sec. by a double-jet method. After completing addition, the pH was adjusted to 5.90 by using sodium carbonate (concentration: 5%) and then, solutions D and E were added thereto.

| Solution A | |
|---|---|
| Alkali process inert gelatin (average molecular weight: 100,000) | 18.7 g |
| Sodium chloride | 0.31 g |
| Solution I (described below) | 1.59 ml |
| Pure water | 1246 ml |
| Solution B | |
| Silver nitrate | 169.9 g |
| Nitric acid (concentration: 6%) | 5.89 ml |
| Pure water added to make | 317.1 ml |
| Solution C | |
| Alkali process inert gelatin (average molecular weight: 100,000) | 5.66 g |
| Sodium chloride | 58.8 g |
| Potassium bromide | 13.3 g |
| Solution I (described below) | 0.85 ml |
| Solution II (described below) | 2.72 ml |
| Pure water added to make | 317.1 ml |
| Solution D | |
| 2-Methyl-4-hydroxt-1,3,3a,7-tetrazaindene | 0.56 g |
| Pure water | 112.1 ml |
| Solution E | |
| Alkali process inert gelatin (average molecular weight: 100,000) | 3.96 g |
| Solution I (described below) | 0.40 ml |
| Pure water | 128.5 ml |

Solution I:
Surfactant: 10% by mass methanol solution of polyisoprene polyethyleneoxide disuccinic acid ester sodium salt
Solution II:
Aqueous 10% by mass rhodium hexachloride complex solution After completion of the foregoing operations, the reaction mixture was subjected to desalting and washing in accordance with conventional flocculation methods. Further thereto, solution F and an anti-mold were added and dispersed at 60° C., the pH was adjusted to 5.9 at 40° C., and finally, there was obtained a bromochloride cubic grain emulsion containing 10 mol % bromide and exhibiting an average grain size of 0.09 µm and coefficient of variation of grain size distribution of 10%.

| Solution F | |
|---|---|
| Alkali process inert gelatin (average molecular weight: 100,000) | 16.5 g |
| Pure water | 139.8 ml |

To the thus obtained silver halide emulsion was added sodium thiosulfate in an amount of 20 mg per mol of silver halide, and chemical sensitization was conducted at 40° C. for 80 min. After completion of chemical sensitization were added 4-hydroxy-6-methyl-1,3,3a,7-tetrazaindene (TAI) of 500 mg per mol of silver halide and 1-phenyl-5-mercaptotetrazole of 150 mg per mol of silver halide, whereby silver halide emulsion EM-1 was obtained. In the thus obtained silver halide emulsion EM-1, the volume ratio of silver halide to gelatin (silver halide/gelatin) was 0.625. Further, a hardener [H-1: tetrakis(vinylsulfonylmethyl)methane] was added in an amount of 200 mg per g of gelatin, and thereto was added a surfactant [SU-2: di(2-ethylhexyl)sulfosuccinate sodium salt], as a coating aid to control surface tension. The thus obtained coating solution was coated onto one side of a transparent 100 µm thick, surface-modified, biaxial-stretched PET film so that a coating amount of gelatin was 0.13 g/m² and subjected to a curing treatment at 50° C. for 24 hrs., whereby a silver halide photographic film was prepared.

The thus prepared film was exposed to light by using an ultraviolet lamp through a photomask of a grid pattern having a line width of 6 μm and a line space of 194 μm, developed by using the following developing solution (DEV-1) at 25° C. for 60 sec. and fixed by using the following fixing solution (FIX-1) at 25° C. for 120 sec. Further, using the following physical developing solution (PDEV-1), physical development was conducted at 25° C. for 10 min. and then, washing and drying were conducted.

DEV-1

| | |
|---|---|
| Pure water | 500 ml |
| Metol | 2 g |
| Sodium sulfite anhydride | 80 g |
| Hydroquinone | 4 g |
| Borax | 4 g |
| Sodium thiosulfate | 10 g |
| Potassium bromide | 0.5 g |
| Water added to make | 1 liter |

FIX-1

| | |
|---|---|
| Pure water | 750 ml |
| Sodium thiosulfate | 250 g |
| Sodium sulfite anhydride | 15 g |
| Glacial acetic acid | 15 ml |
| Potassium alum | 15 g |
| Water added to make | 1 liter |

PDEV-1

The following solutions A and B were mixed immediately before being processed.

| Solution A | |
|---|---|
| Pure water | 400 ml |
| Citric acid | 10 g |
| Disodium hydrogen phosphate | 1 g |
| Ammonia water (28% aqueous solution) | 1.2 ml |
| Hydroquinone | 3 g |
| Solution B | |
| Pure water | 10 ml |
| Silver nitrate | 0.4 g |

Washing and Drying Treatment

A washing treatment was conducted under flowing water for 10 min. A drying treatment was conducted by drying wind (50° C.) until reaching the dried state to prepare a metal conductive pattern A.

Metal Conductive Pattern B

A metal conductive pattern B of a 10 μm width and 160 μm space distance was formed with an Ag paste ink by using an electrostatic ink-jet printer on one side of a transparent 100 μm thick, surface-modified, biaxial-stretched PET film.

Metal Conductive Pattern C

A metal conductive pattern C of a 20 μm width and a 160 μm pitch was formed with an Ni paste ink by printing on one side of a transparent 100 μm thick, surface-modified, biaxial-stretched PET film.

Transparent Conductive Material 1

To an aqueous solution containing ferrous sulfate and sodium citrate was added an aqueous silver nitrate solution to reduce silver ions, whereby a colloidal dispersion containing silver nanoparticles exhibiting an average particle size of 10 nm was prepared.

To an aqueous solution containing ferrous sulfate and sodium citrate was added an aqueous palladium acetate solution to reduce palladium ions, whereby a colloidal dispersion containing palladium nanoparticles exhibiting an average particle size of 2.4 nm was prepared. The colloidal dispersion of silver nanoparticles and the colloidal dispersion of palladium nanoparticles were mixed in a molar ratio of 1:3 with stirring to perform compounding through a self-assembling reaction to obtain a colloidal dispersion of silver-palladium composite nanoparticles.

The thus obtained colloidal dispersion of silver-palladium composite nanoparticles was subjected to a washing treatment and a concentrating treatment (concentration: 30% by mass) by using an ultrafiltration filter of a molecular weight cut off (MWCO) of 10000. To a dispersion of conductive polymer PEDOT/PSS at a concentration of 1.3% by mass (Baytron PH500, made by H.C. Starck Co.) was added dimethylsulfoxide (DMSO, made by WAKO JUNYAKU Co., Ltd.) at an amount of 5% by mass of PEDOT/PSS and stirred until the respective components became homogeneous. Further thereto was added the foregoing colloidal dispersion of silver-palladium composite nanoparticles so that the volume fraction of silver-palladium composite nanoparticles was 40% in the dried transparent conductive film, whereby a transparent conductive material 1 was obtained.

Transparent Conductive Material 2

To an aqueous solution of 3,4-ethylenedioxythiophene monomer and poly(styrene sulfonic acid) in a ratio of 1:2.5 were added an aqueous solution of chloroauric acid ($HAuCL_4 \cdot 4H_2O$) and iron sulfate so that the Au content was 1.0% by mass, whereby polymerization of polyethylene dioxythiophene and formation of gold nanoparticles were simultaneously performed to obtain an aqueous metal nanoparticle-containing conductive polymer solution. Subsequently, from this aqueous solution, the product was taken out and purified with distilled water, and then dispersed in distilled water to obtain a transparent conductive material 2.

Transparent Conductive Material 3

To 87 parts by mass of an aqueous 20% sodium dodecylbenzenesulfonate was added 13 parts by mass of a highly pure mono-layered carbon nanotube (made by Carbon Nanotechnologies Inc., hereinafter also denoted simply as SWNT), while stirring at 100 rpm and subsequently, an ultrasonic treatment was conducted for 1 hr. Then, using an acrylamide gel, a buffer g for migration was adjusted to a pH of 8 and gel electrophoresis was conducted under the condition of a migration temperature of 20° C. and an applied voltage of 200 V to perform cutting-off of the carbon nanotube. Subsequently, a voltage was applied perpendicular to the migration direction to recover only nanotubes having a fiber length of not less than 1 μm from the gel to prepare a 10% by mass carbon nanotube dispersion. Then, 3,4-ethylenedioxythiophene (PEDOT) was subjected to oxidative polymerization in the presence of poly(styrenesulfonic acid) in an aqueous medium in accordance with a known method to obtain an aqueous 20% dispersion of PEDOT:PSS as a conductive polymer. The aqueous dispersion obtained at this stage contained 50% PSS and 20% ethylene glycol. To 50 parts by mass of an aqueous 40% solution of 1-ethyl-3-methylimidazolium:$BF_4$ (hereinafter, also denoted as $EMIBF_4$) obtained by adding $EMIBF_4$ as an ionic liquid to an aqueous 20% solution of sodium dodecylbenzenesulfonate was added 50 parts by mass of an aqueous 20% dispersion of the foregoing PEDOT:PSS to prepare an aqueous 10% by mass conductive polymer solution. To 100 parts by mass of the conductive polymer was added 100 parts by mass of the carbon nanotube dispersion and stirred for 1 hr. to obtain a transparent conductive polymer 3.

Preparation of Transparent Conductive Film 101

The transparent conductive material 1 was coated on the metal conductive pattern A so that the layer thickness after being dried was 40 nm and the volume fraction of silver palladium composite nanoparticles was 40%, and dried at 110° C. for 5 min. to prepare a transparent conductive film 101.

Preparation of Transparent Conductive Film 102 and 103

Transparent conductive films 102 and 103 were prepared in the same manner as the transparent conductive film 101, except that the metal conductive pattern A was replaced by the conductive pattern B or C.

Preparation of Transparent Conductive Film 104

A conductive polymer solution which was prepared by adding DMSO, made by WAKO JUNYAKU Co., Ltd. in an amount of 5% by mass of PEDOT/PSS to a dispersion of PEDOT/PSS (Baytron PH500, made by H.C. Starck Co.) was coated on the metal conductive pattern A so that its dry thickness was 100 nm, and dried at 110° C. for 5 min.; after forming a 10 nm thick aluminum film thereon by a vapor deposition method (25° C., $10^{-3}$ Pa), the film was returned to atmospheric pressure and allowed to stand at room temperature for 24 hrs. to obtain a transparent conductive film 104.

Preparation of Transparent Conductive Film 105

The transparent conductive material 2 was coated on the metal conductive pattern A so that its dry thickness was 100 nm, and dried at 110° C. Further, after forming a 10 nm thick aluminum film thereon by a vapor deposition method (25° C., $10^{-3}$ Pa), the film was returned to atmospheric pressure and allowed to stand at room temperature for 24 hrs. to obtain a transparent conductive film 105.

Preparation of Transparent Conductive Film 106

Transparent conductive film 106 was prepared in the same manner as the transparent conductive film 101, except that the transparent conductive material was replaced by the transparent conductive material 3.

Preparation of Transparent Conductive Film 107

A silver nanowire having an average diameter of 60 nm and an average length of 5.5 μm was prepared with reference to the method described in document 1 Chem. Mater. 2002, 14, 4736-4745). The prepared silver nanowire was filtered off, washed with water and dispersed in ethanol so that the silver nanowire content was 0.5%. The thus obtained silver nanowire dispersion was coated on the metal conductive pattern A at a thickness of 100 nm and dried. Further thereon, a conductive polymer solution which was prepared by adding DMSO, made by WAKO JUNYAKU Co., Ltd. in an amount of 5% by mass of PEDOT/PSS to a dispersion of PEDOT/PSS (Baytron PH500, made by H.C. Starck Co.) was coated so that a dry thickness was 100 nm, and dried to prepare transparent conductive film 107.

Preparation of Transparent Conductive Film 108

Transparent conductive film 108 was prepared in the same manner as the transparent conductive film 107, except that the Baytron PH500 was replaced by the transparent conductive material 2.

Preparation of Transparent Conductive Film 109

A 40 nm thick ITO was formed on the overall surface of metal conductive pattern A by a sputtering method known in the art to prepare a transparent conductive film 109.

Preparation of Transparent Conductive Film 110

A transparent conductive film 110 was prepared in the same manner as the transparent conductive film 109, except that the metal conductive pattern A was replaced by the metal conductive pattern B.

Preparation of Transparent Conductive Film 111

A conductive polymer solution which was prepared by adding DMSO, made by WAKO JUNYAKU Co., Ltd. in an amount of 5% by mass of PEDOT/PSS to a dispersion of PEDOT/PSS (Baytron PH500, made by H.C. Starck Co.) was coated on the metal conductive pattern A so that a dry thickness was 100 nm, and dried at 110° C. for 5 min, to prepare a transparent conductive film 111.

Preparation of Transparent Conductive Film 112

A transparent conductive film 112 was prepared similarly to the transparent conductive film 107, provided that only the silver nanowire dispersion was coated and dried, and nothing was coated thereon.

Thus prepared transparent conductive films 101-112 were each measured with respect to total light transmittance and surface resistance.

Total Light Transmittance

Measurement was conducted by using a haze meter, HGM-2B, produced by Suga Shikenki Co., Ltd., based JIS K 7361-1: 1997.

Surface Resistance

Measurement was conducted by using Rhoresta GP (Type MCP-T610), produced by Mitsubishi Kagaku Corp., based on JIS K 719: 1994 (Resistivity test method of conductive plastic by a four-point probe method).

The evaluation results are shown in Table 1.

TABLE 1

| Transparent Conductive Film | Metal Conductive Pattern | Transparent Conductive Material | Surface Resistance (Ω) | Transmittance (%) | Remark |
|---|---|---|---|---|---|
| 101 | A | PEDOT/PSS + Ag – Pd particle | 8 | 88 | Inv. |
| 102 | B | PEDOT/PSS + Ag – Pd particle | 9 | 85 | Inv. |
| 103 | C | PEDOT/PSS + Ag – Pd particle | 7 | 88 | Inv. |
| 104 | A | PEDOT/PSS + Al | 9 | 86 | Inv. |
| 105 | A | PEDOT/PSS + Au + Al | 8 | 86 | Inv. |
| 106 | A | PEDOT/PSS + CNT + $EMIBF_4$ | 9 | 88 | Inv. |

TABLE 1-continued

| Transparent Conductive Film | Metal Conductive Pattern | Transparent Conductive Material | Surface Resistance (Ω) | Transmittance (%) | Remark |
|---|---|---|---|---|---|
| 107 | A | PEDOT/PSS + Ag nanowire | 7 | 87 | Inv. |
| 108 | A | PEDOT/PSS + Au + Ag nanowire | 6 | 86 | Inv. |
| 109 | A | ITO | 9 | 85 | Comp. |
| 110 | B | ITO | 9 | 85 | Comp. |
| 111 | A | PEDOT/PSS | 10 | 84 | Comp. |
| 112 | A | Ag nanowire | 9 | 84 | Comp. |

Into 2.5 g of dimethylsulfoxide were added 90 mg of sodium iodide and 75 mg of silver iodide and after being completely dissolved, 0.5 g of titanium oxide was added and completely dispersed by an ultrasonic disperser. To this solution was added 150 mg of polyvinyl alcohol (saponification degree: 87-89%; polymerization degree: 4500) and stirred for 1 hr. with heating at 120° C. to obtain an electrolyte solution.

A silver electrode as an opposed electrode was prepared in such a manner that after Cu film was formed on the overall surface of a 1.5 mm thick, 2 cm×4 cm glass substrate by a conventional sputtering method, a pattern of a 30 μm electrode spacing and a 180 μm electrode width was formed in the longitudinal direction of the glass substrate by a photolithography method and a 10 μm thick silver was deposited on the Cu electrode by an electrolytic plating method to form the silver electrode.

Spherical polyacryl beads having an average particle size of 20 μm were added at a volume fraction of 4% by volume to the foregoing electrolyte solution. The thus obtained solution was sandwiched between the silver electrode and each of the transparent conductive films 101 to 112 and the edge portion was sealed by compression at a pressure of 9.8 Pa to prepare display elements 201-212. A superimposed 2 cm×2 cm portion is the display area and the residual portion is a lead area.

Thus prepared display elements 201 to 212 were measured with respect to black-and-white conversion response speed and repetitive durability, according to the following manner.

Black-and-White Conversion Response Rate

As shown in FIG. 1, a silver electrode 1 and a transparent conductive film 2 are connected to a size D battery (power source 4) and the time necessary for completion of conversion of white to black after being switched on was visually measured.

Repetitive Durability

After black-and-white conversion was repeated 500 times by reversing positive and negative electrodes of the power source, the response rate was measured in the same manner described above.

The evaluation results are shown in Table 2.

TABLE 2

| Display Element | Metal Conductive Pattern | Transparent Conductive Material | Response Speed (second) | Repeated Durability (second) | Remark |
|---|---|---|---|---|---|
| 201 | A | PEDOT/PSS + Ag – Pd particle | 4 | 4 | Inv. |
| 202 | B | PEDOT/PSS + Ag – Pd particle | 3 | 3 | Inv. |
| 203 | C | PEDOT/PSS + Ag – Pd particle | 6 | 7 | Inv. |
| 204 | A | PEDOT/PSS + Al | 4 | 5 | Inv. |
| 205 | A | PEDOT/PSS + Au + Al | 4 | 4 | Inv. |
| 206 | A | PEDOT/PSS + CNT + EMIBF$_4$ | 5 | 6 | Inv. |
| 207 | A | PEDOT/PSS + Ag nanowire | 2 | 3 | Inv. |
| 208 | A | PEDOT/PSS + Au + Ag nanowire | 2 | 2 | Inv. |
| 209 | A | ITO | 10 | 12 | Comp. |
| 210 | B | ITO | 11 | 14 | Comp. |
| 211 | A | PEDOT/PSS | 13 | 17 | Comp. |
| 212 | A | Ag nanowire | 10 | 16 | Comp. |

As is apparent from Table 2, it is proved that samples related to the invention exhibited enhanced black-and-white conversion response speed in display elements employing the electrodeposition method, although there is no substantial difference in surface resistance in FIG. 1. It is presumed that a low resistance value of a transparent conductive material resulted in enhanced in-plane uniformity.

What is claimed is:

1. A transparent conductive film as an electrode comprising a metal conductive pattern provided on a transparent film substrate and further thereon a transparent conductive material layer, wherein the transparent conductive material layer comprises a conductive polymer and at least one of a conductive fiber and a conductive metal, and the metal conductive pattern having a line width of not less than 1 μm and not more than 100 μm.

2. The transparent conductive film as claimed in claim 1, wherein the conductive metal comprises transparent metal nanoparticles.

3. The transparent conductive film as claimed in claim 1, wherein the transparent conductive material layer comprises a base metal-modified conductive polymer formed of the conductive polymer and a base metal.

4. The transparent conductive film as claimed in claim 1, wherein the conductive fiber comprises a metal nano-wire.

5. The transparent conductive film as claimed in claim 1, wherein the transparent conductive material layer comprises an ionic liquid.

6. The transparent conductive film as claimed in claim 1, wherein the metal conductive pattern comprises silver.

7. The transparent conductive film as claimed in claim 2, wherein the transparent metal nanoparticle is selected from the group consisting of gold, platinum, silver, copper, zinc, palladium, rhodium, iridium, ruthenium, nickel, aluminum, tin, lead, carbon and titanium.

8. The transparent conductive film as claimed in claim 4, wherein the metal of the metal nano-wire is selected from the group consisting of Ag, Cu, Au, Al, Rh, ir, Co, Zn, Ni, In, Fe, Pd, Pt, Sn, and Ti.

* * * * *